United States Patent [19]

Raab

[11] Patent Number: 4,613,770

[45] Date of Patent: Sep. 23, 1986

[54] VOLTAGE MONITORING CIRCUIT

[75] Inventor: Herman P. Raab, Indianapolis, Ind.

[73] Assignee: Consolidated Investments and Development Corp., Carmel, Ind.

[21] Appl. No.: 678,024

[22] Filed: Dec. 4, 1984

Related U.S. Application Data

[60] Division of Ser. No. 458,447, Jan. 17, 1983, Pat. No. 4,503,431, which is a continuation-in-part of Ser. No. 191,840, Sep. 29, 1980, abandoned.

[51] Int. Cl.⁴ .................. H03K 5/153; G01R 19/165; G01R 19/175

[52] U.S. Cl. .................................. 307/350; 307/358; 307/360; 328/146

[58] Field of Search ............... 307/350, 354, 358, 360; 328/146, 147

[56] References Cited

U.S. PATENT DOCUMENTS 3,916,262 10/1975 Easter .................................. 328/146

*Primary Examiner*—John Zazworsky

*Attorney, Agent, or Firm*—Barnes & Thornburg

[57] ABSTRACT

A circuit for determining whether a voltage is within a lower voltage range (+12 VDC) or a higher voltage range (+24 VDC) is provided. This circuit includes a resistor-based voltage-scaling circuit, a zener diode reference voltage circuit, and comparators for comparing the scaled voltages across the voltage-scaling circuit and zener diode circuit and for switching in response to the comparison outcome. The comparator output has a first state when the voltage is within acceptable limits in either the 12 VDC or 24 VDC range and a second state when the voltage is outside the acceptable range. Additional comparator circuitry switches the sensitivity of the resistor-scaling network between the 12 VDC and 24 VDC ranges.

8 Claims, 1 Drawing Figure

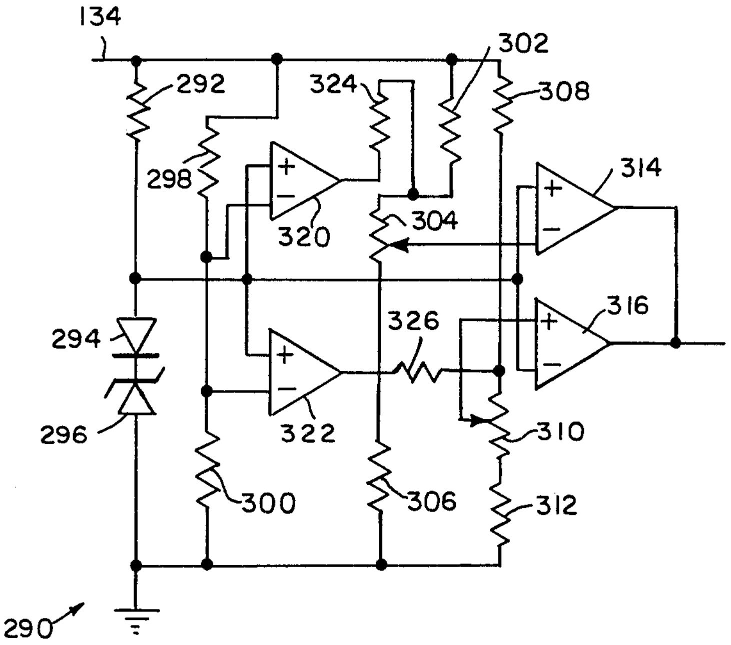
134
292
298
324
302
308
314
320
304
294
326
316
322
296
310
300
306
312
290

VOLTAGE MONITORING CIRCUIT

This application is a divisional application of my co-pending application U.S. Ser. No. 458,447 filed Jan. 17, 1983, now U.S. Pat. No. 4,503,431. U.S. Pat. No. 4,503,431 is a continuation-in-part of my co-pending application Ser. No. 191,840, filed Sept. 29, 1980 now abandoned.

This invention relates to voltage sensing systems, and more particularly, to a system for sensing whether a voltage is within one of two voltage ranges or outside either of them.

Voltage-sensing systems are known. Typically, known voltage sensing systems will sense whether a voltage is above a certain limit, below a certain limit, or within a certain range. Typically, the known voltage sensing systems which sense whether a voltage is within a range will do so for only one range. Those systems which sense whether a voltage is within one of a plurality of ranges generally provide a separate comparison circuit for each voltage range. For example, in U.S. Pat. No. 3,916,262, an over-voltage protection circuit is disclosed. This circuit provides a first comparator for determining when the voltage reaches a first level and a second comparator for determining when the voltage has reached a second level. Depending upon which level the voltage has reached, different operations are initiated. For example, when the voltage exceeds a lower level, a power supply might be put into a shut-down mode and, when the voltage exceeds a higher level, a clamping or short-circuit function might be initiated.

According to the invention, a system is provided for determining whether a direct current voltage across a pair of terminals is within either of two acceptable absolute magnitude ranges, one a higher absolute magnitude range, and the other a lower absolute magnitude range. The two absolute magnitude ranges do not overlap. The system also determines whether the voltage across the pair of terminals is in a "forbidden" range which lies outside the two acceptable ranges. The system comprises means for establishing a reference direct current voltage which is lower than the lower limit of the low magnitude range. The system further includes resistive networks for scaling the voltage across the terminals to provide two voltages, the first of which is equal to the reference voltage when the voltage across the pair of terminals is at the high magnitude end of the low magnitude range. The second of the two voltages provided by the resistive networks is equal to the reference voltage when the voltage across the pair of terminals is at the low magnitude end of the low magnitude range. The system further includes a comparison and switching means having a first state when one of the two scaled voltages has a magnitude less than the magnitude of the reference voltage, and the other of the two scaled voltages has a magnitude greater than the magnitude of the reference voltage. The comparison and switching means has a second state when the magnitudes of the two scaled voltages lie both above, or both below, the magnitude of the reference voltage. The second state comprises a warning state wherein the voltage across the pair of terminals lies outside the lower range of acceptable voltages. In order to accept the voltage across the pair of terminals in the higher magnitude voltage range, second comparison and switching means is provided which compares a scaled value of the voltage across the pair of terminals to the reference voltage. The second comparison and switching means has a first state when the voltage across the pair of terminals is less in absolute magnitude than the median value of the two voltage ranges, and a second state when the voltage across the pair of terminals is greater in absolute magnitude than the median value of the two voltage ranges. In the second state, the second comparison and switching means effectively connects load resistors to the two resistive networks such that the two scaled voltages are further reduced in absolute magnitude, and the first of the scaled voltages is equal to the reference voltage when the voltage across the terminals is at the high magnitude end of the higher magnitude range, and the second of the scaled voltages is equal to the reference voltage when the voltage across the terminals is at the low magnitude end of the high magnitude range.

The invention may best be understood by referring to the following detailed description and accompanying drawing which illustrates the invention.

The drawing illustrates a voltage sensing circuit 290 constructed according to this invention.

In circuit 290, a series combination of a resistor 292, a diode 294, and a zener diode 296 in coupled between a conductor 134 and ground. A series combination of a resistor 298 and a resistor 300 is coupled between conductor 134 and ground. A series combination of a resistor 302, a potentiometer 304, and a resistor 306 is coupled between conductor 134 and ground. Finally, a series combination of a resistor 308, a potentiometer 310, and a resistor 312 is coupled in series between conductor 134 and ground. The series combination of resistor 292, diode 294, and zener diode 296 establishes a reference direct current voltage which is less than the least acceptable voltage limit of a lower voltage operating range, illustratively a +12 volt operating range. This reference voltage is established at the anode of diode 294. Resistive network 302, 304, 306 and resistive network 308, 310, 312 scale down the potential difference across conductor 134 to ground to provide two voltages, one on the wiper of potentiometer 304 and one on the wiper of potentiometer 310. The first of these voltages, on the wiper of potentiometer 304, is equal to the reference voltage when the potential difference across conductor 134 to ground is at the high end of the lower magnitude (+12 V) range. The second of these, the voltage on the wiper of potentiometer 310, is equal to the reference voltage when the potential difference across conductor 134 to ground is at the low end of the low magnitude (+12 V) range. These two voltages, along with the reference voltage at the anode of diode 294, are supplied to input terminals of two comparators 314, 316. The wipers of potentiometers 304, 310, respectively, are set such that the voltage at the inverting (−) input terminal of comparator 314 will equal the reference voltage at the anode of diode 294 when the voltage on conductor 134 is at the high end of the lower magnitude (+12 V) range, and the voltage at the non-inverting (+) input terminal of comparator 316 will equal the reference voltage at the anode of diode 294 when the voltage on conductor 134 is at the low end of the low magnitude (+12 V) range. Therefore, when the two scaled-down voltages bracket the reference voltage, the comparator 314, 316 output terminals are both "high." When the voltage on conductor 134 exceeds the high end of the low magnitude (+12 V) range, the output terminal of comparator 314 goes "low." When the voltage on conductor 134 drops below the low end of the low magnitude (+12 V) range, the output terminal of comparator 316 goes "low."Either of these latter conditions indicates that the voltage across conductor 134 to ground is not within the lower magnitude (+12 V) range.

In order to accept a conductor 134 voltage in a higher magnitude range, illustratively +24 V, additional comparators 320, 322 and load resistors 324, 326 are provided. When the potential on conductor 134 is above the median of the two voltage ranges, the potential at the inverting (−) input terminals of both comparators 320, 322 exceeds the reference voltage at the anode of diode 294 and the non-inverting (+) input terminals of these comparators 320, 322. Under this condition, the output terminals of both of comparators 320, 322 are "low," and resistors 324, 326, respectively, are placed in parallel with resistors 304, 306, and 310, 312. Under this condition, the potentials on the wipers of potentiometers 304, 310 are adjusted downward sufficiently that these potentials lie within the range of values which will control comparators 314, 316. That is, the potentials on the wipers of potentiometes 304, 310 are within the scaled low magnitude (+12 V) range. Under all other conditions, the output states of comparators 314, 316 will indicate that the voltage across conductor 134 to ground is not within the higher magnitude (+24 V) range.

What is claimed is:

1. A system for determining whether a direct current voltage across a pair of terminals is within an acceptable lower absolute magnitude range, or within an acceptable higher absolute magnitude range, or in a forbidden zone outside either of these ranges, comprising means for scaling down the voltage across the terminals to provide a first voltage related in magnitude to the voltage across the terminals, means for establishing a reference direct current voltage, means for comparing the first related voltage to the reference voltage and for switching in response to comparison outcome, the comparing and switching means having a first state when the first related voltage corresponds to a voltage across the terminals which is within the acceptable lower absolute magnitude range, and second means for comparing a second voltage related in magnitude to the voltage across the terminals to the reference voltage to determine whether the voltage across the terminals is greater than the highest acceptable magnitude of the lower magnitude range by a predetermined amount and for switching in response to such comparison outcome, the second comparing means having a first state when the voltage across the terminals does not exceed the highest acceptable limit of the lower magnitude range by the predetermined amount and a second state when the voltage across the terminals exceeds the highest acceptable limit of the lower magnitude range by the predetermined amount, the second comparing means, when in its second state, scaling down the first related voltage.

2. A system for determining whether a direct current voltage across a pair of terminals is within an acceptable lower absolute magnitude range, or within an acceptable higher absolute magnitude range, or in a forbidden zone outside either of these ranges, comprising means for scaling the voltage appearing across the terminals, means for establishing a reference direct current voltage, means for comparing the scaled voltage to the reference voltage and for switching in response to comparison outcome, the comparing and switching means having a first state when the voltage across the terminals is within the acceptable lower absolute magnitude range and a second state when the voltage across the terminals is outside the acceptable lower absolute magnitude range, and second means for comparing the voltage across the terminals to the reference voltage to determine whether the voltage across the terminals is greater than a median of the lower absolute magnitude range and higher absolute magnitude range and for switching in response to such comparison outcome, the second comparing means having a first state when the voltage across the terminals is less than the median of the lower absolute magnitude range and the higher absolute magnitude range and a second state when the voltage across the terminals exceeds the median of the lower absolute magnitude range and the higher absolute magnitude range, the second comparing means, when in its second state, scaling the already once scaled voltage.

3. A system for determining whether a direct current voltage across a pair of terminals is within an acceptable lower absolute magnitude voltage range, or within an acceptable higher absolute magnitude voltage range, or in a forbidden zone outside either of these ranges, comprising means for establishing a reference voltage, first comparing means, means for coupling the voltage across the terminals to the first comparing means, the first comparing means comparing the voltage across the terminals as coupled thereto to the reference voltage and determining if the voltage across the terminals falls within the lower voltage range and providing an output signal indicative thereof, means for coupling the reference voltage establishing means to the first comparing means, second comparing means, and means for coupling the voltage across the terminals to the second comparing means, the second comparing means comparing the voltage coupled thereto to the reference voltage and scaling down the voltage coupled to the first comparing means when the voltage across the terminals exceeds an upper limit of the lower voltage range by a predetermined amount, the output signal of the first comparing means then indicating whether the voltage across the terminals falls within the higher voltage range.

4. The system of claim 3 wherein the means for coupling the voltage across the terminals to the first comparing means includes means for scaling down the voltage across the terminals, the second comparing means scaling down the already scaled down voltage when it determines that the voltage across the terminals exceeds the upper limit of the lower voltage range by the predetermined amount.

5. The system of claim 4 wherein the first comparing means comprises a comparator.

6. The system of claim 4 wherein the first comparing means comprises first and second comparators, and means for coupling the first and second comparators together.

7. The system of claim 5 wherein the means for coupling the voltage across the terminals to the first comparing means comprises a resistive voltage divider having a first resistance and a second resistance coupled together at a junction, the first and second resistances coupled across the terminals, the junction of the first and second resistances coupled to the first comparing means, means for resistively coupling the first resistance to the second comparing means, the second comparing means including means to couple a third resistance across the second resistance to scale down further the voltage coupled to the first comparing means when the second comparing means determines that the voltage across the terminals exceeds the upper limit of the lower voltage range by a predetermined amount.

8. The system of claim 6 wherein the means for coupling the voltage across the terminals to the first comparing means comprises first and second resistive voltage dividers, each having a first resistance and a second resistance coupled together at a junction, the first and second resistances coupled across the terminals and the junctions of the first and second resistances of the first and second voltage dividers, respectively, coupled to inputs of the first and second comparators, and means for coupling the first resistances to the second comparing means, the second comparing means including means for switching a third resistance across each of the second resistances when the second comparing means determines that the voltage across the terminals has exceeded the upper limit of the lower voltage range by the predetermined amount.

* * * * *